US 8,324,617 B2

(12) United States Patent
Okumoto et al.

(10) Patent No.: US 8,324,617 B2
(45) Date of Patent: Dec. 4, 2012

(54) ORGANIC ELECTROLUMINESCENCE ELEMENT AND MANUFACTURING METHOD THEREOF

(75) Inventors: Kenji Okumoto, Kyoto (JP); Hidehiro Yoshida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/916,944

(22) Filed: Nov. 1, 2010

(65) Prior Publication Data

US 2011/0042703 A1 Feb. 24, 2011

Related U.S. Application Data

(63) Continuation of application No. PCT/JP2009/004626, filed on Sep. 16, 2009.

(30) Foreign Application Priority Data

Sep. 19, 2008 (JP) .................................. 2008-241238

(51) Int. Cl.
*H01L 51/54* (2006.01)

(52) U.S. Cl. ........... 257/40; 257/E51.019; 257/E51.018; 313/504; 313/506

(58) Field of Classification Search .................. 313/503, 313/504, 506; 257/40, E51.018, E51.019
See application file for complete search history.

(56) References Cited

U.S. PATENT DOCUMENTS

| | | | |
|---|---|---|---|
| 7,057,208 B2 * | 6/2006 | Akimoto et al. ................ 257/59 |
| 7,158,161 B2 | 1/2007 | Gyoutoku et al. | |
| 7,208,567 B2 | 4/2007 | Oguma et al. | |
| 7,276,297 B2 | 10/2007 | Lee et al. | |
| 7,285,905 B2 * | 10/2007 | Hanawa et al. ................ 313/504 |
| 7,535,164 B2 | 5/2009 | Nakajima et al. | |
| 7,626,195 B2 * | 12/2009 | Shin ................................ 257/40 |
| 8,029,684 B2 | 10/2011 | Nakajima et al. | |
| 2002/0064966 A1 | 5/2002 | Seki et al. | |
| 2003/0227021 A1 * | 12/2003 | Yamazaki et al. .............. 257/83 |
| 2004/0002576 A1 | 1/2004 | Oguma et al. | |
| 2004/0021414 A1 | 2/2004 | Hanawa et al. | |

(Continued)

FOREIGN PATENT DOCUMENTS

CN 1481656 3/2004

(Continued)

OTHER PUBLICATIONS

Korea Office action in 10-2010-7009804, mail date is Sep. 29, 2011.

(Continued)

*Primary Examiner* — Matthew W Such
*Assistant Examiner* — Scott Stowe
(74) *Attorney, Agent, or Firm* — Greenblum & Bernstein, P.L.C.

(57) ABSTRACT

The organic electroluminescence element includes a substrate and an anode metal layer above the substrate. The anode metal layer includes an inner region between a pair of outer regions. A metal oxide layer is above the inner region and the outer regions of the anode metal layer. An insulating layer is above the metal oxide layer and the outer regions of the anode metal layer. A hole transport layer is above the metal oxide layer and the inner region of the anode metal layer. An organic luminescent layer is above the hole transport layer. A cathode layer is above the organic luminescent layer for injecting electrons into the organic luminescent layer. A thickness of the metal oxide layer on the inner region of the anode metal layer is greater than a thickness of the metal oxide layer on the outer regions of the anode metal layer.

25 Claims, 8 Drawing Sheets

U.S. PATENT DOCUMENTS

| | | |
|---|---|---|
| 2004/0166761 A1 | 8/2004 | Seki et al. |
| 2005/0031901 A1 | 2/2005 | Lee et al. |
| 2005/0208206 A1 | 9/2005 | Yoshikawa |
| 2005/0264186 A1 | 12/2005 | Seki et al. |
| 2005/0264187 A1 | 12/2005 | Seki et al. |
| 2005/0266169 A1 | 12/2005 | Seki et al. |
| 2006/0284166 A1 | 12/2006 | Chua et al. |
| 2007/0018150 A1* | 1/2007 | Nakajima et al. ............ 257/10 |
| 2007/0018152 A1 | 1/2007 | Seki et al. |
| 2007/0063639 A1 | 3/2007 | Hamano et al. |
| 2007/0065180 A1 | 3/2007 | Yatsunami |
| 2007/0172978 A1 | 7/2007 | Chua et al. |
| 2007/0241665 A1 | 10/2007 | Sakanoue et al. |
| 2008/0067927 A1 | 3/2008 | Hanawa et al. |
| 2008/0315760 A1 | 12/2008 | Seki et al. |
| 2009/0009075 A1 | 1/2009 | Seki et al. |
| 2009/0163108 A1 | 6/2009 | Nakajima et al. |
| 2009/0224233 A1 | 9/2009 | Obata et al. |
| 2009/0284141 A1 | 11/2009 | Sakanoue et al. |
| 2009/0302333 A1 | 12/2009 | Seki et al. |
| 2010/0102310 A1 | 4/2010 | Komatsu et al. |
| 2010/0187513 A1 | 7/2010 | Okumoto |
| 2010/0237341 A1 | 9/2010 | Okumoto et al. |
| 2010/0258833 A1 | 10/2010 | Okumoto et al. |

FOREIGN PATENT DOCUMENTS

| | | |
|---|---|---|
| CN | 1592527 | 3/2005 |
| CN | 1901246 | 1/2007 |
| JP | 2002-222695 | 8/2002 |
| JP | 2004-002703 | 1/2004 |
| JP | 2005-005159 | 1/2005 |
| JP | 2005-268099 | 9/2005 |
| JP | 2006-294261 | 10/2006 |
| JP | 2007-527542 | 9/2007 |
| JP | 2007-288071 | 11/2007 |
| JP | 2009-123696 | 6/2009 |
| WO | 2004/100282 | 11/2004 |
| WO | 2007/086520 | 8/2007 |

OTHER PUBLICATIONS

International Search Report for PCT/JP2009/004626, mailing date of Dec. 8, 2009.

JP Office Action for corresponding JP Appl. No. 2010-519291, dated Aug. 17, 2010.

JP Office Action for corresponding JP Appl. No. 2010-518190, dated Aug. 17, 2010.

JP Office Action for corresponding JP Appl. No. 2010-233071, dated Jan. 25, 2011.

Chinese Office Action in Chinese Patent Application No. 200980101526.6, dated Jul. 4, 2012.

* cited by examiner

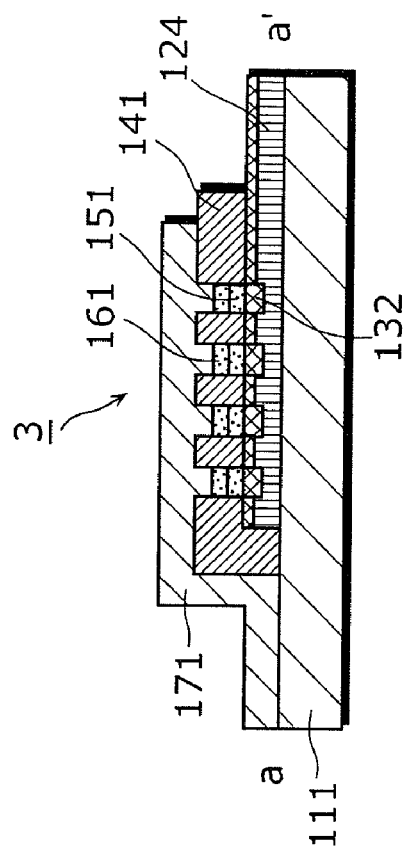
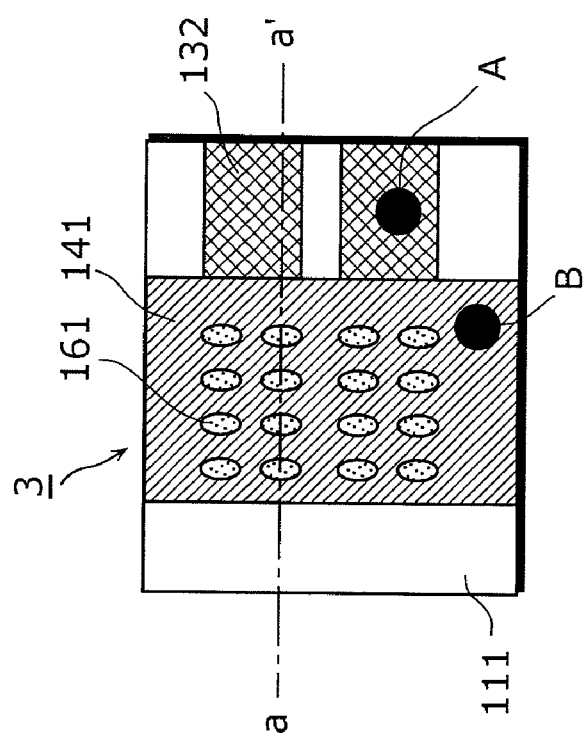
FIG. 5B
FIG. 5A

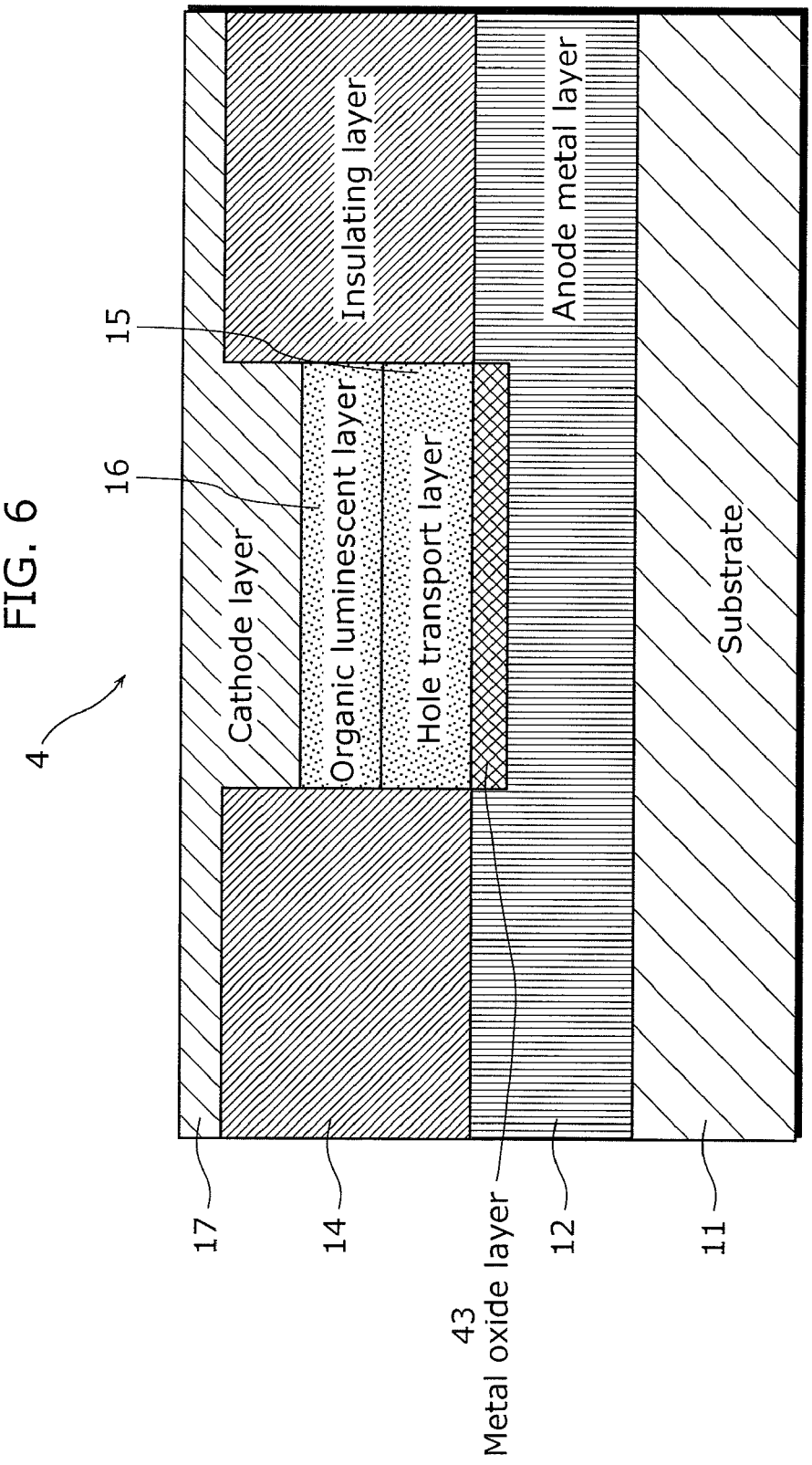

ORGANIC ELECTROLUMINESCENCE ELEMENT AND MANUFACTURING METHOD THEREOF

CROSS REFERENCE TO RELATED APPLICATION

This is a continuation application of PCT Application No. PCT/JP2009/004626 filed Sep. 16, 2009, designating the United States of America, the disclosure of which, including the specification, drawings, and claims, is incorporated herein by reference in its entirety.

The disclosure of Japanese Patent Application No. 2008-241238 filed on Sep. 19, 2008 including the specification, drawings, and claims is incorporated herein by reference in its entirety.

BACKGROUND OF THE INVENTION

1. Field of the Invention

The present invention relates to organic electroluminescence elements and manufacturing methods thereof, and particularly relates to an organic electroluminescence element used for a display device or lighting, and a manufacturing method thereof.

2. Description of the Related Art

An organic electroluminescence element (hereinafter referred to as an organic EL element), which has a structure in which an organic layer including a luminescent layer is sandwiched between an anode and a cathode, is a device that takes out luminescence by injecting holes through the anode and electrons through the cathode and by recombining the injected holes and electrons inside the luminescent layer.

The organic EL element is suitable for cost reduction and making the element flexible, since the organic layer composing the organic EL element can be easily formed by a wet process such as a printing method.

Furthermore, the application of the organic EL elements for use such as the main display of mobile phone has already started. However, the organic EL elements are inferior to competing liquid crystal displays in terms of capability such as the half-life of the display luminance and the cost reflecting the manufacturing method, and improvement is needed.

Particularly, with regard to the manufacturing method, the organic layer of the currently-available commercial organic EL element is formed by the vacuum deposition, which does not make the best use of the features of organic EL.

On the other hand, the manufacturing method forming the organic layer by the wet process has advantages in efficiency for using material, production time, and cost for manufacturing the device. Furthermore, upon application to the display, pixels ranging a large area are painted separately by the printing method. Accordingly, problems such as uneven surfaces or a deflection in a metal mask used for patterning in the vacuum deposition do not arise.

On the other hand, when forming multiple organic layers by the wet process, there is a problem that it is difficult to form multiple layers, since a lower layer generally elutes to a solution when the solution for an upper layer is dropped. The capability of the organic EL element improves by stacking multiple organic layers which have various functions. Accordingly, this is a significant problem. For this reason, the capability of the organic EL element manufactured by the wet process is significantly lower then the organic EL element manufactured by the vacuum deposition. In order to achieve practical use of the organic EL element manufactured by the wet process, it is essential to develop a device structure suitable for the wet process and its manufacturing method.

Patent Literature 1 (Japanese Unexamined Patent Application Publication (Translation of PCT Application) No. 2007-527542) discloses a device structure of the multilayered organic EL element by the wet process and its manufacturing method. According to Patent Literature 1, the hole injection layer made of aqueous organic material is formed on a transparent electrode on a substrate. This layer does not elute on the organic layer. The hole-transporting material including cross-linker is formed using organic solvent, and the film is cross-linked and insolubilized through an optical process after forming the film. Next, as a luminescent layer, the third layer made of a luminescent organic material is formed of the organic solvent. Finally, the cathode is formed by vapor deposition method, forming the element.

The organic EL element with the above described structure disclosed in Patent Literature 1 is high in capability such as the driving voltage, the luminescence efficiency, and the product life. However, water-soluble conductive material such as the compound of Poly(3,4-ethylenedioxythiophene)) (PEDOT) and Poly(styrenesulfonate) (PSS) shown in the chemical formula below and used for the hole injection layer are generally acidic solution, and cause a problem to corrode devices such as an ink-jet nozzle.

(Chemical Formula)

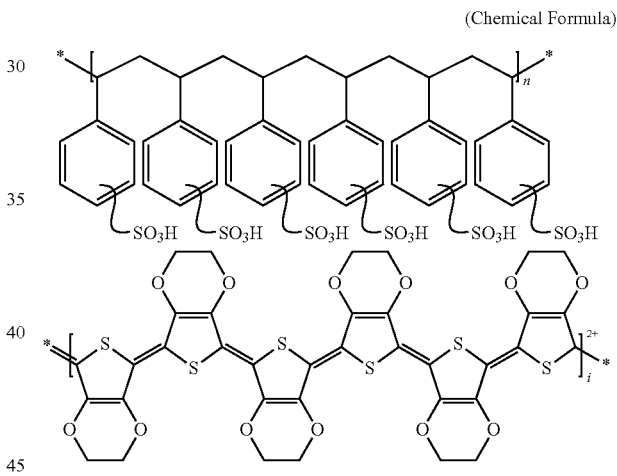

In addition, this compound is not a complete solution but dispersed fine particles, and thus there is a problem of clogging the ink-jet nozzle. Furthermore, since the conductance is too high, when even at least a part of the film contacts the cathode, the leak current increases.

Omitting the hole injection layer which, is the first layer and injecting holes directly to the hole transport layer which is the second layer are solutions to the problem caused by the use of the ink-jet nozzle. This procedure not only solves the problem but also is significantly advantageous to the manufacturing cost such as the manufacturing devices and production time. However, when forming the hole transport layer which is the second layer directly on an anode made of, for example, commonly-used indium tin oxide (hereinafter referred to as ITO), the holes are not fully injected, significantly reducing the luminescence efficiency and the product life. This is a problem significant in application-type hole transport material which requires mixture of the cross-linking agent and with which hole transporting property decreases.

In contrast, Patent Literature 2 (Japanese Unexamined Patent Application Publication No. 2007-288071) discloses a structure which prevents the problem caused by the use of the ink-jet nozzle and the reduction in the hole-transport property. Patent Literature 2 discloses forming a metal oxide layer made of, for example, molybdenum oxide or vanadium oxide which has large work functions and are advantageous for injecting the holes with regard to the energy level, as an inorganic hole injection layer. These are insoluble to organic solvents, and thus they do not cause a problem of elution when the organic solvent is wet-applied on the metal oxide layer.

Furthermore, for example, Patent Literature 3 (Japanese Unexamined Patent Application Publication No. 2002-222695) discloses a method for painting the organic material separately by a printing method using the wet process. According to the method in Patent Literature 3, using the water repellant insulating layer called bank determines the luminescent part of the organic EL element in an opening where the bank is not formed, and holds the organic solvent on the surface of anode at the hydrophilic opening.

SUMMARY OF THE INVENTION

However, the structure and the manufacturing method of the organic EL element disclosed in Patent Literatures 2 and 3 have the following problem.

When the hole injection layer including metal oxide disclosed in Patent Literature 2 is formed after forming and patterning the insulating layer disclosed in Patent Literature 3 forms metal oxide on the entire surface, including the surface of the insulating layer and the opening. This eliminates the difference between the hydrophilicity of the opening and the water-repellency of the insulating layer, and the organic solution to be wet-applied afterward will flow out of the pixels.

When the hole injection layer made of the metal oxide is formed before forming the insulating layer instead of the process, the metal oxide is water-soluble, and thus the metal oxide elutes a water-based developing solution or a delaminating solution used for patterning the insulating layer. Accordingly, the capability such as the luminescent property and product life decreases as the hole injection property decreases.

In view of the problem, it is an object of the present invention to provide an organic EL element which has high capability in terms of the luminescence efficiency and product life, and has a simple manufacturing process using a wet film formation for forming the organic layer, and a manufacturing method thereof.

In order to achieve the above object, an organic electroluminescence element (hereinafter referred to as an organic EL element) according to an aspect of the present invention includes: a substrate; an anode metal layer formed on the substrate; an insulating layer formed on the anode metal layer in a first region; a metal oxide layer formed on the anode metal layer, at least in a second region which is other than the first region, through an oxidation of a surface of the anode metal layer stacked on the substrate; a hole transport layer formed on the metal oxide layer in the second region where the insulating layer is not formed, the hole transport layer including a hole-transporting organic material; an organic luminescent layer formed on the hole transport layer; and a cathode layer formed on the organic luminescent layer, which injects electrons into the organic luminescent layer, in which an upper surface of the anode metal layer in the second region is located below an upper surface of the anode metal layer in the first region.

The organic EL element according to an aspect of the present invention has a remarkable hole injection property, can reduce the number of organic layers, and can form an organic layer by wet printing. Accordingly, it is possible to provide an organic EL element that has excellent power consumption and driving life, and has a simple manufacturing process.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5A is a top view of an organic EL device including the organic EL elements manufactured by the manufacturing method according to Example 1 of the present invention;

FIG. 5B is a structural cross-section view of the organic EL device including the organic EL elements manufactured by the manufacturing method according to Example 1 of the present invention;

FIG. 6 is a structural cross-section view of an organic EL element according to Embodiment 2 of the present invention;

DESCRIPTION OF THE PREFERRED EMBODIMENTS

Figure 1:
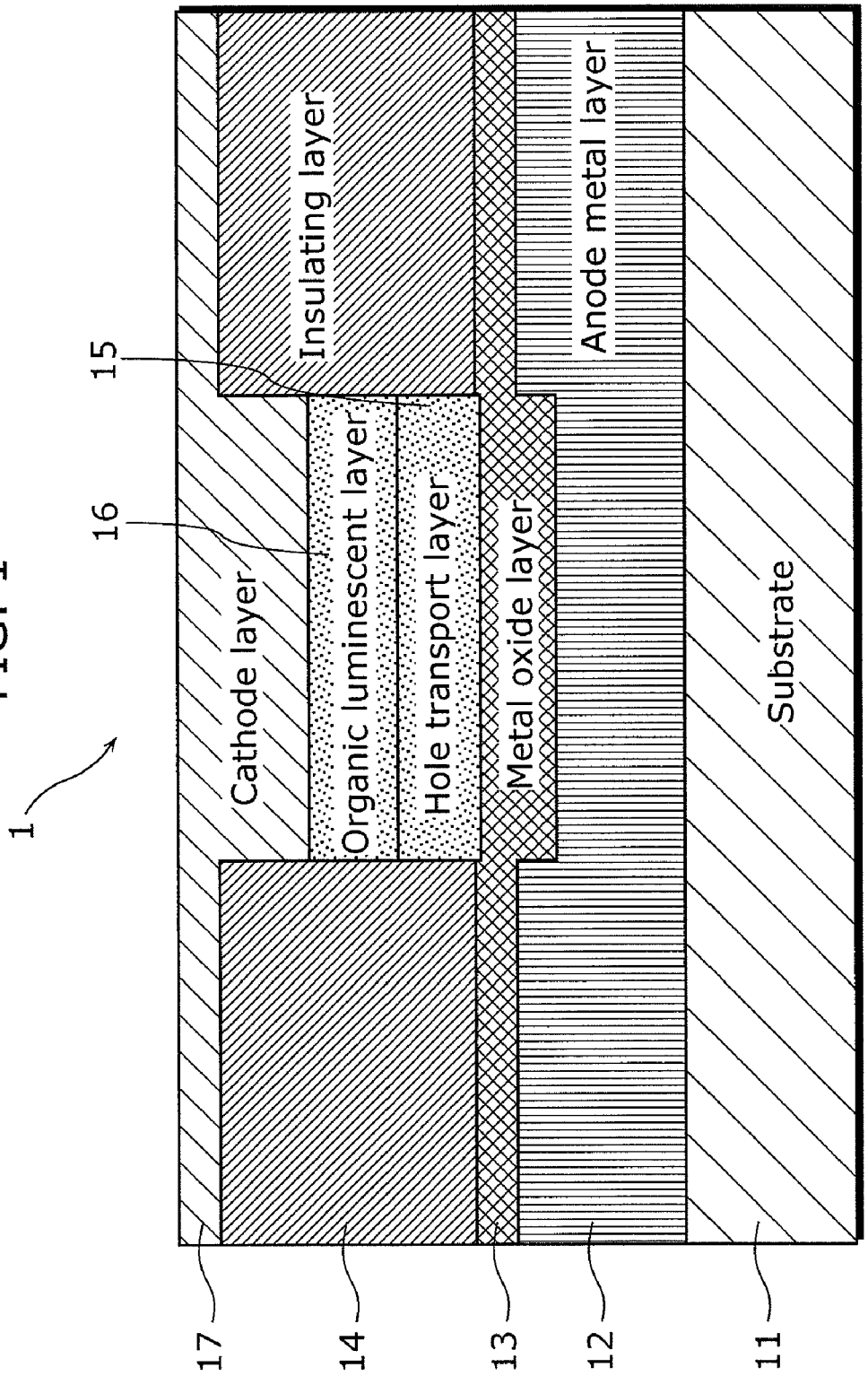
FIG. 1 is a structural cross-section view of an organic EL element according to Embodiment 1 of the present invention.

The organic EL element according to a first aspect of the present invention is an organic electroluminescence element including: a substrate; an anode metal layer formed on the substrate; an insulating layer formed on the anode metal layer in a first region; a metal oxide layer formed on the anode metal layer in the first region and in a second region which is other than the first region, through an oxidation of a surface of the anode metal layer stacked on the substrate; a hole transport layer formed on the metal oxide layer in the second region where the insulating layer is not formed, the hole transport layer including a hole-transporting organic material; an organic luminescent layer formed on the hole transport layer; and a cathode layer formed on the organic luminescent layer, which injects electrons into the organic luminescent layer, in which a thickness of the metal oxide layer in the second region is greater than a thickness of the metal oxide layer in the first region.

According to this aspect, the thickness of the metal oxide layer in the second region is greater than the thickness of the metal oxide layer in the first region. Thus, it is possible to produce an effect in preventing the insulating layer and the metal oxide layer in the first region from delaminating and in maintaining the adhesiveness of the both layers, while satisfying a sufficient hole injection property in the second region.

The organic electroluminescence element according to a second aspect of the present invention includes, in the organic electroluminescence element according to the first aspect of the present invention, a lower surface of the metal oxide layer in the second region located below a lower surface of the metal oxide layer in the first region.

According to this aspect, the lower surface of the metal oxide layer in the second region is located below the lower surface of the metal oxide layer in the first region. Thus, there is a level difference between the first and second regions of the metal oxide layer, and the level difference produces an effect in reducing a guided wave loss of luminescence.

The organic electroluminescence element according to a third aspect of the present invention is an organic electroluminescence element including: a substrate; an anode metal layer formed on the substrate; an insulating layer formed on the anode metal layer in a first region; a metal oxide layer formed on the anode metal layer in the first region and in a second region which is other than the first region, through an oxidation of a surface of the anode metal layer stacked on the substrate; a hole transport layer formed on the metal oxide layer in the second region where the insulating layer is not formed, the hole transport layer including a hole-transporting organic material; an organic luminescent layer formed on the hole transport layer; and a cathode layer formed on the organic luminescent layer, which injects electrons into the organic luminescent layer, in which the metal oxide layer in the first region and the metal oxide layer in the second region are continuously arranged, and a lower surface of the anode metal layer in the second region is located below a lower surface of the anode metal layer in the first region, at a boundary of the first region and the second region.

According to this aspect, the lower surface of the metal oxide layer in the second region is located below the lower surface of the metal oxide layer in the first region at the boundary of the first region and the second region. Thus, there is a level difference between the first and second regions of the metal oxide layer, and the level difference produces an effect in reducing a guided wave loss of luminescence.

The organic electroluminescence element according to a fourth aspect of the present invention is an organic electroluminescence element including: a substrate; an anode metal layer formed on the substrate; an insulating layer formed on the anode metal layer in a first region; a metal oxide layer formed on the anode metal layer, not in the first region but in a second region which is other than the first region, through an oxidation of a surface of the anode metal layer stacked on the substrate; a hole transport layer formed on the metal oxide layer in the second region where the insulating layer is not formed, the hole transport layer including a hole-transporting organic material; an organic luminescent layer formed on the hole transport layer; and a cathode layer formed on the organic luminescent layer, which injects electrons into the organic luminescent layer, in which the metal oxide layer has sides and a lower surface that are coated by the anode metal layer.

According to this aspect, the sides and the lower surface of the metal oxide layer are coated with the anode metal layer. Thus, it produces an effect in preventing a part of luminescence from leaking outside the element through the metal oxide layer, reducing the guided wave loss of the luminescence.

The organic electroluminescence element according to a fifth aspect of the present invention includes, in the organic electroluminescence element according to one of the first to the fourth aspects of the present invention, the anode metal layer including: an anode metal lower layer having a 60% or higher visible light reflectivity; and an anode metal upper layer stacked on a surface of the anode metal lower layer.

According to this embodiment, a metal having a high reflectivity can be used as an anode metal lower layer, independent of the anode metal upper layer to be oxidized. This expands the material selection for each layer, facilitating optimization of the capability of top-emission organic EL element.

The organic electroluminescence element according to a sixth aspect of the present invention includes, in the organic electroluminescence element according to the fifth aspect of the present invention, the anode metal lower layer made of an alloy including at least one of aluminum and silver, and the anode metal upper layer that is made of a metal including at least one of molybdenum, chrome, vanadium, tungsten, nickel, and iridium.

According to this aspect, it is possible to use a metal having high reflectivity as the anode metal lower layer, further facilitating optimization of the capability of the top-emission organic EL element. Furthermore, a metal element having a work function that increases by the oxidization is selected as the anode metal upper layer. Accordingly, it is possible to form the hole injection layer having excellent hole injection property with the metal oxide layer.

The organic electroluminescence element according to a seventh aspect of the present invention includes, in the organic electroluminescence element according to the fifth aspect of the present invention, the anode metal upper layer in the second region that is 20 nm or less in thickness.

According to this aspect, it is possible to reduce the reflectivity by the anode metal upper layer, that is, the attenuation of the luminescence of the top-emission organic EL element can be suppressed, making the most of the high reflectivity of the anode metal lower layer.

The organic electroluminescence element according to an eighth aspect of the present invention includes, in the organic electroluminescence element according to the seventh aspect of the present invention, the anode metal upper layer not formed in the second region.

According to this aspect, the anode metal upper layer is completely transformed to the metal oxide layer, enabling maximization of the reflectivity of the anode metal lower layer.

The organic electroluminescence element according to a ninth aspect of the present invention includes, in the organic electroluminescence element according to one of the first to the fourth aspects of the present invention, the anode metal upper layer made of a metal including at least one of silver, molybdenum, chrome, vanadium, tungsten, nickel, and iridium.

According to this aspect, the metal oxide layer which has an opening in which a part of the anode metal layer is oxidized has a large work function. Accordingly, the metal oxide layer has a high hole injection property, and allows the implementation of an organic EL element having superior capabilities such as the luminescence efficiency and the product life.

The lighting device according to a tenth aspect of the present invention includes a lighting device including the organic electroluminescence element according to one of the first to the fourth aspects of the present invention.

The image display device according to an eleventh aspect of the present invention includes an image display device including the organic electroluminescence element according to one of the first to the fourth aspects of the present invention.

Embodiment 1

An organic electroluminescence element (hereinafter referred to as an organic EL element) according to this embodiment includes: an anode metal layer formed on a substrate; an insulating layer formed on the anode metal layer in a first region; a metal oxide layer formed on the anode metal layer, in the first region and a second region; a hole transport layer formed on the metal oxide layer where the insulating layer is not formed; an organic luminescent layer formed on the hole transport layer; and a cathode layer formed on the organic luminescent layer, in which an upper surface of the anode metal layer in the second region is located below an upper surface of the anode metal layer in the first region. This allows forming an organic layer that has superior hole injection property by wet printing and capable of reducing the number of organic layers.

The following specifically describes specific description of Embodiment 1 of the organic EL element according to the present invention with reference to the drawing in detail.

FIG. 1 is a structural cross-sectional view of the organic EL element according to Embodiment 1 of the present invention. The organic EL element 1 in FIG. 1 includes a substrate 11, an anode metal layer 12, a metal oxide layer 13, an insulating layer 14, a hole transport layer 15, an organic luminescent layer 16, and a cathode layer 17.

Although the material of the substrate 11 is not particularly limited, a glass substrate or a quartz substrate is used, for example. Furthermore, it is possible to make the organic EL element flexible by using plastic substrates made of polyethylene terephthalate or polyether sulfone. The structure embodied by the present invention is particularly effective for top-emission organic EL element, and thus it is possible to use an opaque plastic substrate or a metal substrate. Furthermore, metal wiring and transistor circuits for driving the organic EL may be formed on the substrate as well.

The anode metal layer 12 is stacked on the surface of the substrate 11, and is an electrode which applies positive voltage with respect to the cathode layer 17 to the organic EL element 1. Oxidation on the surface of the anode metal layer in the manufacturing process which is collectively described in the examples forms the metal oxide layer 13. Accordingly, considering the requested capability of the metal oxide layer 13 to be oxidized and formed in the later process, metallic element whose work function becomes greater by the metal oxidation is selected as the anode metal layer 12. This is due to the fact that the metal oxide layer having a high hole injection property requires large work function. Examples of metal element materials include, though not particularly limited, a metal which is any of silver, molybdenum, chrome, vanadium, tungsten, nickel, or iridium, an alloy of any of the metals, or a stack of the metals.

The metal oxide layer 13 has a function to inject holes to the hole transport layer 15 to be described layer, through stably injecting the holes or by supporting the generation of the hole. As described before, the metal oxide layer 13 is formed though oxidation of the surface of the anode metal layer though the process collectively described in the examples. Furthermore, the metal oxide layer 13 has a large work function, since the metal oxide layer 13 is made of the metal element described above.

Accordingly, the organic EL element 1 according to the present invention has a high hole injecting property, thus it is possible to have a high luminescence efficiency and long product life property.

Furthermore, regarding the boundary face between the metal oxide layer 13 and the anode metal layer 12, the boundary face at an opening which is a second region where the insulating layer 14 is not formed has shorter distance to the upper surface of the substrate 11 than the boundary face in a first region, which is under the insulating layer 14.

In other words, the thickness of the anode metal layer 12 in the second region is smaller than the thickness of the anode metal layer 12 in the first region. This structure is naturally formed when using the manufacturing process according to the present invention.

The metal oxide layer 13 preferably has a thickness of 0.1 nm to 20 nm. More preferable thickness range is 1 nm to 10 nm. When the metal oxide layer 13 is too thin, the hole injection property becomes lower due to the problem caused by uniformity, and the driving voltage rises when the metal oxide layer 13 is too thick.

The process for forming the metal oxide layer 13 on the surface of the anode metal layer 12 is not particularly limited. However, ultraviolet-ozone process, plasma treatment process in oxidized gas atmosphere, or a process using a solution including ozone can be suitably used on the surface of the anode metal layer during the manufacturing process.

The insulating layer 14 has a function as a bank layer for forming the hole transport layer 15 and the organic luminescent layer 16 which are formed by the wet printing method in a predetermined region.

As the insulating layer 14, water-repellent material that has a resistivity equal to or higher than $10^5$ Ωcm is used, although not particularly limited to this material. The material having resistivity equal to or less than $10^5$ Ωcm may cause the insulating layer 14 to be a source of a leak current between the anode and the cathode or a leak current between adjacent pixels, resulting in various problems such as an increase in consumption power. Furthermore, when hydrophilic material is used as the insulating layer 14, the surface of the metal oxide layer 13 is generally hydrophilic, and thus the difference in the hydrophilicity and water repellency between the surfaces on the insulating layer 14 and the metal oxide layer 13 becomes small. As a result, it is difficult to selectively hold the ink including organic material for forming the hole transport layer 15 and the organic luminescent layer 16 at the opening.

Although the material used for the insulating layer 14 may be either inorganic or organic materials, organic materials are more preferably used due to its high water repellency in general. Examples of such materials include polyimide and polyacryl. Fluorine may be introduced for higher water repellency.

Furthermore, the insulating layer 14 may be composed of two or more layers, and may be a combination the above-described materials. Alternatively, a combination in which inorganic material is used for a first layer and organic material is used for a second layer may be used.

In order to form a portion that effectively operates as an organic EL element, it is necessary for the insulating layer 14 to be patterned in a predetermined form, and to include at least one opening. Although the method for patterning is not particularly limited, it is preferable to use photolithography method using the photosensitive material.

The opening may be pixel-shaped, providing an opening for each pixel, or may be line-shaped, including multiple pixels along one direction of the display panel.

The hole transport layer 15 has a function to transport the holes injected from the metal oxide layer 13 into the organic luminescent layer 16. Hole-transporting organic material can be used for the hole transport layer 15. The hole-transporting organic material is an organic material which transmits the generated holes through the charge-transfer reaction among molecules. This material is also referred to as p-type organic semiconductor. Accordingly, the hole transport layer 15 is between the metal oxide layer 13 which is the electron injection layer and the organic luminescent layer, and has a function to transport the hole charge.

The hole transport layer 15 may be made of high-molecular material or low-molecular material. The hole transport layer 15 is preferably formed by wet printing method, and it is preferable for the hole transport layer 15 to include a cross-linking agent which prevents the organic luminescent layer 16 from being eluted when forming the organic luminescent layer 16 which is the upper layer. Copolymer including fluorine sites and triarylamine sites and low-molecular triarylamine derivative are examples of the hole-transporting material. Dipentaerythritol hexaacrylate is an example of the cross-linking agent.

Although the wet printing method for forming the hole transport layer 15 is not particularly limited, nozzle jet methods represented by the ink-jet method or a dispenser layer can be used. In this case, the ink-jet method is a method in which the metal oxide layer 15 is formed by spraying the organic film forming material transformed into an ink from a nozzle to the metal oxide layer 13.

The organic luminescent layer 16 becomes luminescent with the injection and re-coupling of the holes and electrons, which generate excited states.

It is necessary that the organic luminescent layer 16 is made of the luminescent organic material that can be formed by the wet printing method. This allows simple and uniform forming of a film on a large screen substrate. The material may be high-molecular material or low-molecular material.

Although it is not particularly limited, the cathode layer 17 is preferably made of material and structure with a transmissivity of 80% or higher. With this, it is possible to implement a top-emission organic EL element with high luminescence efficiency and an organic EL element with superior consumption power and half-life of luminance.

Although there is no particular limit on the structure of the cathode layer 17 as the transparent cathode, a structure which includes a layer which includes an alkaline-earth metal, a layer including electron-transporting organic material and an alkaline-earth metal, and a metal oxide layer. As the alkaline-earth metal, magnesium, calcium, and barium are suitably used. Although there is no particular limit on the electron-transporting organic material, electron-transporting organic semiconductor material is used. Furthermore, although there is no particular limit on the metal oxide layer, a layer made of Indium Tin Oxide (hereinafter referred to as ITO) or Indium Zinc Oxide is used.

Another example of the cathode layer 17 uses a structure in which a layer including alkali metal, an alkaline-earth metal or their halide and a layer which includes silver in that order. The layer including silver may be solely silver, or silver alloy. Furthermore, a highly transparent refractive index adjusting layer may be provided on the layer, in order to increase the efficiency in taking light out.

In the organic EL element 1 according to Embodiment 1 of the present invention, the lower surface of the metal oxide layer 13 in the second region is located below the lower surface of the metal oxide layer 13 in the first region.

The upper surface of the anode metal layer 12 in the second region is located below the upper surface of the anode metal layer 12 in the first region.

Furthermore, the thickness of the metal oxide layer 13 in the second region is greater than the thickness of the metal oxide layer 13 in the first region.

According to the embodiment, oxidation of the anode metal layer 12 provides a large work function between the anode metal layer 12 and the organic luminescent layer 16, reducing the energy barrier with respect to hole injection.

Thus, it is possible to form the hole injection layer with superior hole injection property, with the metal oxide layer. Furthermore, it is not necessary to form the hole injection layer with an organic layer, and thereby the number of organic layers can be reduced. Furthermore, it is possible to form an organic layer on the hole injection layer by wet printing.

Figure 2:
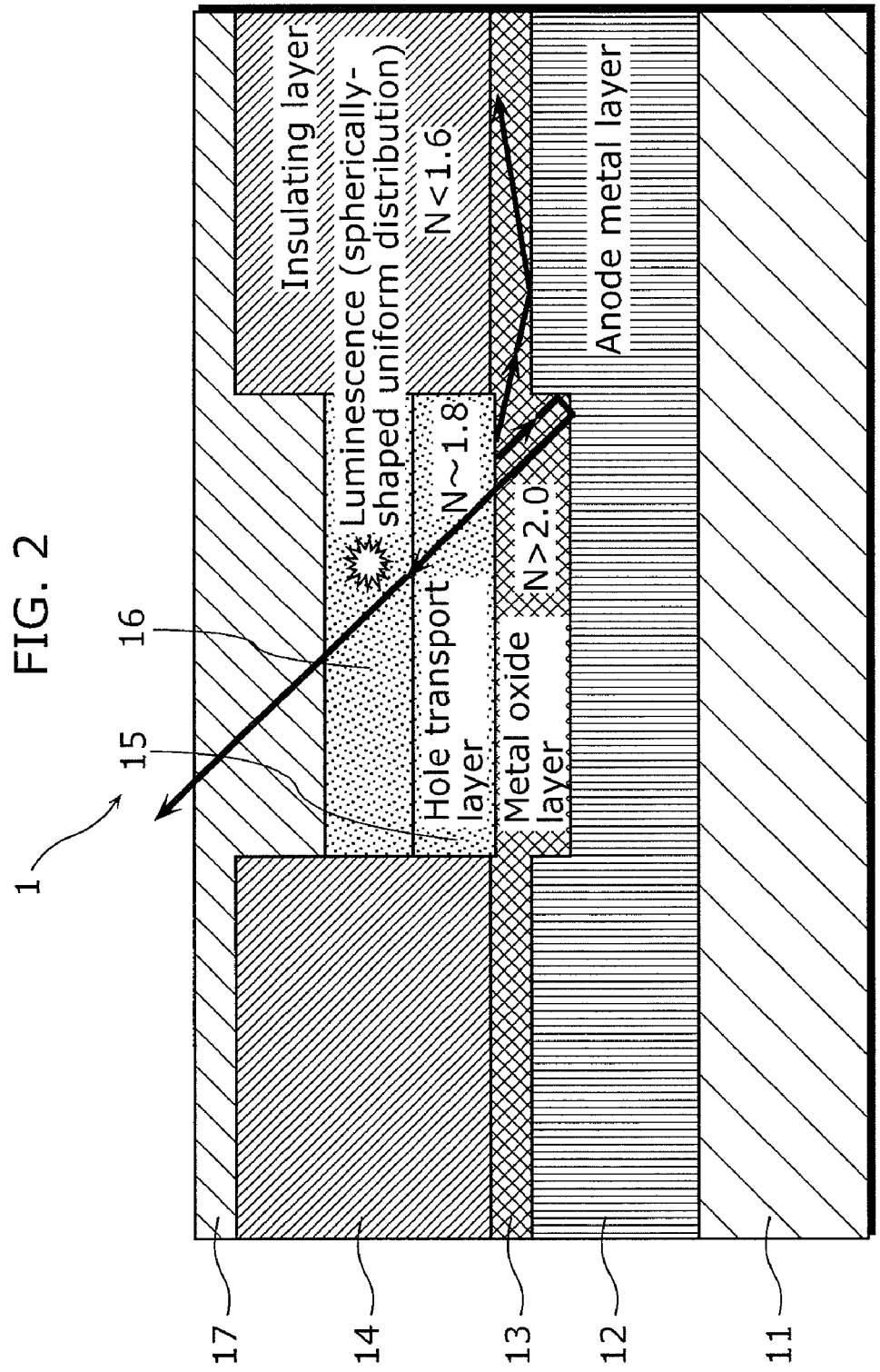
FIG. 2 is a structural cross-section view of the organic EL element according to Embodiment 1 of the present invention, describing the effect in reducing the guided wave loss.

FIG. 2 is a diagram describing an effect of reducing guided waves loss by the organic EL element according to Embodiment 1 of the present invention.

Light that was luminescent on the organic luminescent layer 16 takes spherical-shaped uniform distribution; that is, isotropically emitted. Part of the emitted light passes through the hole transport layer 15 and reaches the metal oxide layer 13. Refractive index of the metal oxide layer 13 is equal to or higher than 2.0 with its composition and structure, and thus the refractive index is higher than the adjacent other layers. Accordingly, the light that entered the metal oxide layer 13 tends to reflect at the boundaries with the other layers. Here, the light that entered the metal oxide layer 13 tends to proceed to the metal oxide layer 13 in the first region, having the metal oxide layer 13 with high refractive index as a waveguide. However, the metal oxide layer 13 according to the present invention has a level difference between the first region and the second region. Thus, the light reflected on the boundary between the metal oxide layer 13 and the other layers reflects within the second region due to the level difference, causing the light to exit from the upper surface of the cathode layer 17. This prevents the light reflected on the boundary between the metal oxide layer 13 and the other layer from exiting outside through the metal oxide layer 13 as a waveguide.

As described above, with the level difference between the first region and the second region of the metal oxide layer 13, it is possible to achieve the effect for reducing the guided wave loss of the luminescence.

Furthermore, according to this embodiment, it is possible to achieve an effect in preventing the insulating layer 14 and the metal oxide layer 13 from delaminating, and in maintaining the adhesion between the two layers in the first region, while satisfying the sufficient hole injection property in the second region.

In general, in a certain surface, the adhesion property with a layer stacked on the surface is high when the surface energy of the surface is high. This is because the surface having a higher surface energy is less stable, and it attempts to reduce the energy through a junction with another layer.

When evaluating this by the wettability test, the greater the surface energy, the smaller the contact angle becomes and the higher the wettability becomes. Furthermore, the surface energy is generally greater on the metal oxide surface than on the metal surface. This is because, the group of metal atoms composed of metal atoms and oxygen atoms generate surface charge caused by the electron polarization than the group of metal atoms composed only of metal atoms, and an unsteady surface appears. Accordingly, the adhesiveness to the upper layer is higher on the metal oxide surface than on the metal surface. In addition, ultra thin oxidized film such as naturally oxidized film is likely to have a metal surface, and thus oxidizing the film for a few nanometers further improves the adhesiveness.

Figure 3:
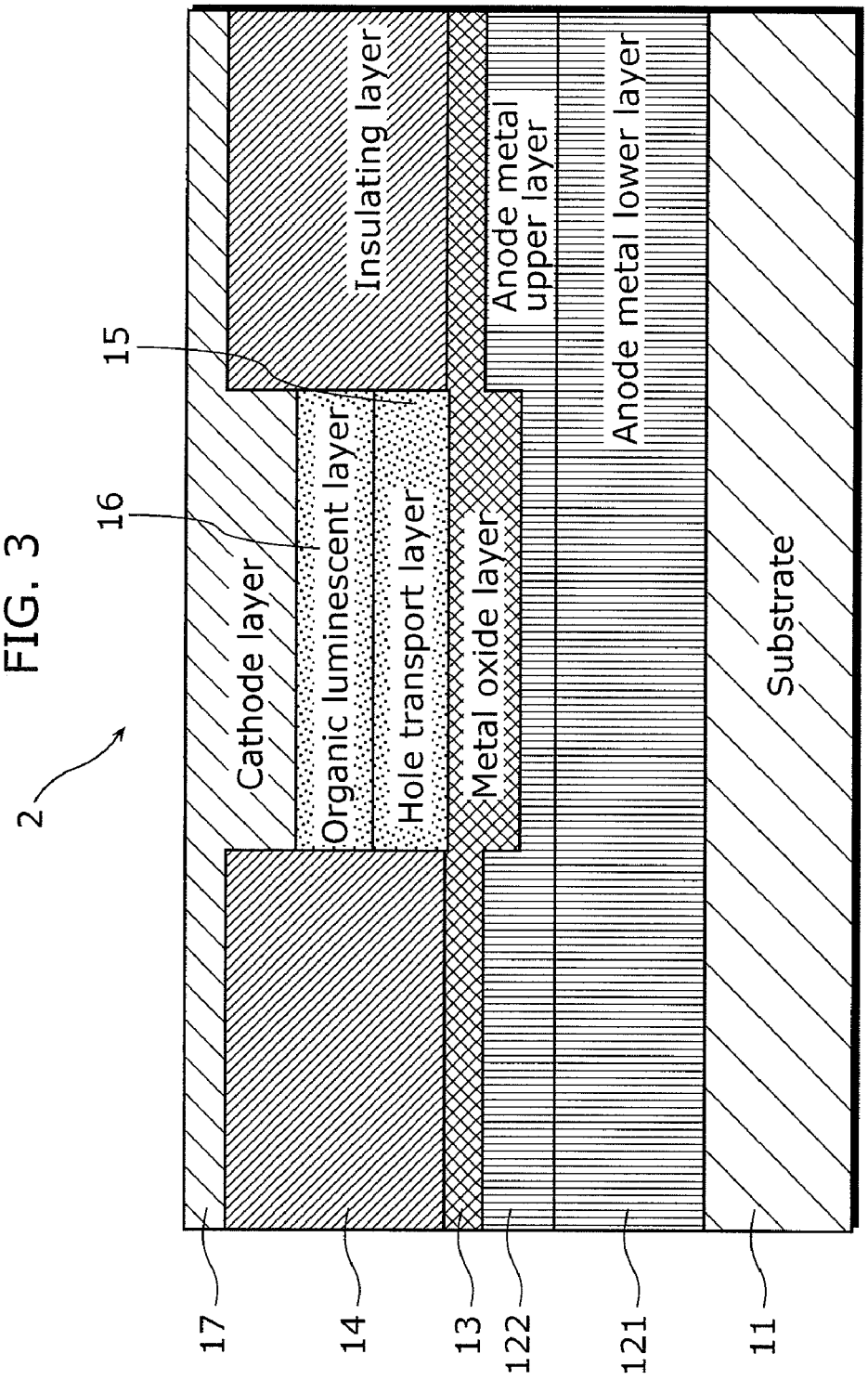
FIG. 3 is a structural cross-section view of an organic EL element according to a variation of Embodiment 1 of the present invention.

FIG. 3 is a structural cross-sectional view of the organic EL element illustrating a variation of Embodiment 1 of the present invention. The organic EL element 2 in FIG. 3 includes a substrate 11, an anode metal lower layer 121, an anode metal upper layer 122, a metal oxide layer 13, an insulating layer 14, a hole transport layer 15, an organic luminescent layer 16, and a cathode layer 17. The organic EL element 2 described in FIG. 2 differs from the organic EL element 1 in FIG. 1 in that the anode metal layer 12 is composed of two layers. The following describes only the difference, omitting the explanation identical to the explanation for the organic EL element 1.

The anode metal lower layer 121 is stacked on the surface of the substrate 11, and is an electrode which applies positive voltage with respect to the cathode layer 17 to the organic EL element 2. It is preferable for the anode metal lower layer 121 to have a 60% or higher visible light reflectivity. Furthermore, the material for the anode metal lower layer 121 includes, for example, silver, aluminum, or alloys including these metals. For example, silver-palladium, silver-palladium-copper, aluminum-neodymium are suitably used as the alloys.

According to this embodiment, a metal having a high reflectivity as an anode metal lower layer can be used, independently of the anode metal upper layer to be oxidized. Thus, the material selection for each layer is expanded, facilitating optimization of the capacity of top-emission organic EL element.

The anode metal upper layer 122 is stacked on the surface of the anode metal lower layer 121. Oxidation of the surface of the anode metal upper layer in the manufacturing process forms the metal oxide layer 13. Accordingly, metallic element whose work function becomes greater by the metal oxidation is selected as the anode metal upper layer 122, considering the requested capability of the metal oxide layer 13 oxidized and formed in the later process. This is due to the fact that the metal oxide layer having a high hole injection property requires large work function. Examples of metal element materials include, though not particularly limited, metal including molybdenum, chrome, vanadium, tungsten, nickel, or iridium, alloy of any of these metals, or a stack of these metals.

This allows forming the metal oxide layer 13 with superior hole injection property.

Furthermore, the thickness of the anode metal upper layer 122 is preferably 20 nm or less. This is because, if the anode metal upper layer 122 is thicker than that, the reflectivity of the organic EL element 2 reflects the reflectivity of the anode metal upper layer 122, which makes it difficult to reflect the reflectivity of the anode metal lower layer 121.

That is, it is possible to suppress the reduction of the reflectivity by the anode metal upper layer, that is, preventing the luminescence of the top-emission organic EL element from attenuating, making the most of the high reflectivity of the anode metal lower layer.

Using the two-layered structure and the metal element can use metal with high reflectivity as the anode metal upper layer 121, independently of the anode metal upper layer 122 which is to be oxidized. Thus, the material selection for each layer is expanded, facilitating optimization of the capacity of top-emission organic EL element.

Note that, when using metal having a 60% or higher visible light reflectivity as a component of the anode metal lower layer 121, the anode metal upper layer 122 may be disappeared on the final stage of manufacturing. In this case, it is possible to minimize the effect of the reflectivity of the anode metal upper layer 122. In this case, the metal oxide layer 13 directly contacts the anode metal lower layer 121 in the final stage of manufacturing.

Furthermore, the anode metal lower layer 121 and the anode metal upper layer 122 may have three or more layers.

Furthermore, the metal oxide layer 13 may not be formed under the insulating layer 14. Generally, in the manufacturing process to be described later, after stacking the anode metal layer 12 or the anode metal upper layer 122 on the substrate 11, a metal oxide film formed by natural oxidation though exposing to air is formed on the surface of the anode metal layer 12 or the anode metal upper layer 122. However, there are cases where the metal oxide film formed by natural oxidation is not formed on the anode metal layer 12 by stacking an insulating film which is the next process without exposing the element in the process in the air. In this case, the metal oxide layer 13 is not formed under the insulating layer 14.

In the above described variation of Embodiment 1, the lower surface of the metal oxide layer 13 in the second region is located under the lower surface of the metal oxide layer 13 in the first region.

The upper surface of the anode metal upper layer 122 in the second region is located lower than the upper surface of the anode metal layer 122 in the first region.

Furthermore, the thickness of the metal oxide layer 13 in the second region is greater than the thickness of the metal oxide layer 13 in the first region.

According to the embodiment, oxidation of the anode metal upper layer 122 provides a large work function between the anode metal upper layer 122 and the organic luminescent layer 16, reducing the energy barrier against hole injection. Thus, it is possible to form the hole injection layer with superior hole injection property using the metal oxide layer. Furthermore, it is not necessary to form the hole injection layer with an organic layer, and thereby the number of organic layers can be reduced. Furthermore, it is possible to form an organic layer on the hole injection layer by wet printing.

Furthermore, according to this embodiment, with the level difference between the first region and the second region of the metal oxide layer 13, it is possible to achieve the effect for reducing the guided wave loss of luminescence.

Furthermore, according to this embodiment, it is possible to achieve an effect in preventing the insulating layer 14 and the metal oxide layer 13 from delaminating and in maintaining adhesion between the two layers in the first region, while satisfying the good hole injection property in the second region.

EXAMPLES

Next, the present invention is described with reference to examples and comparative examples.

Example 1

Figure 4:
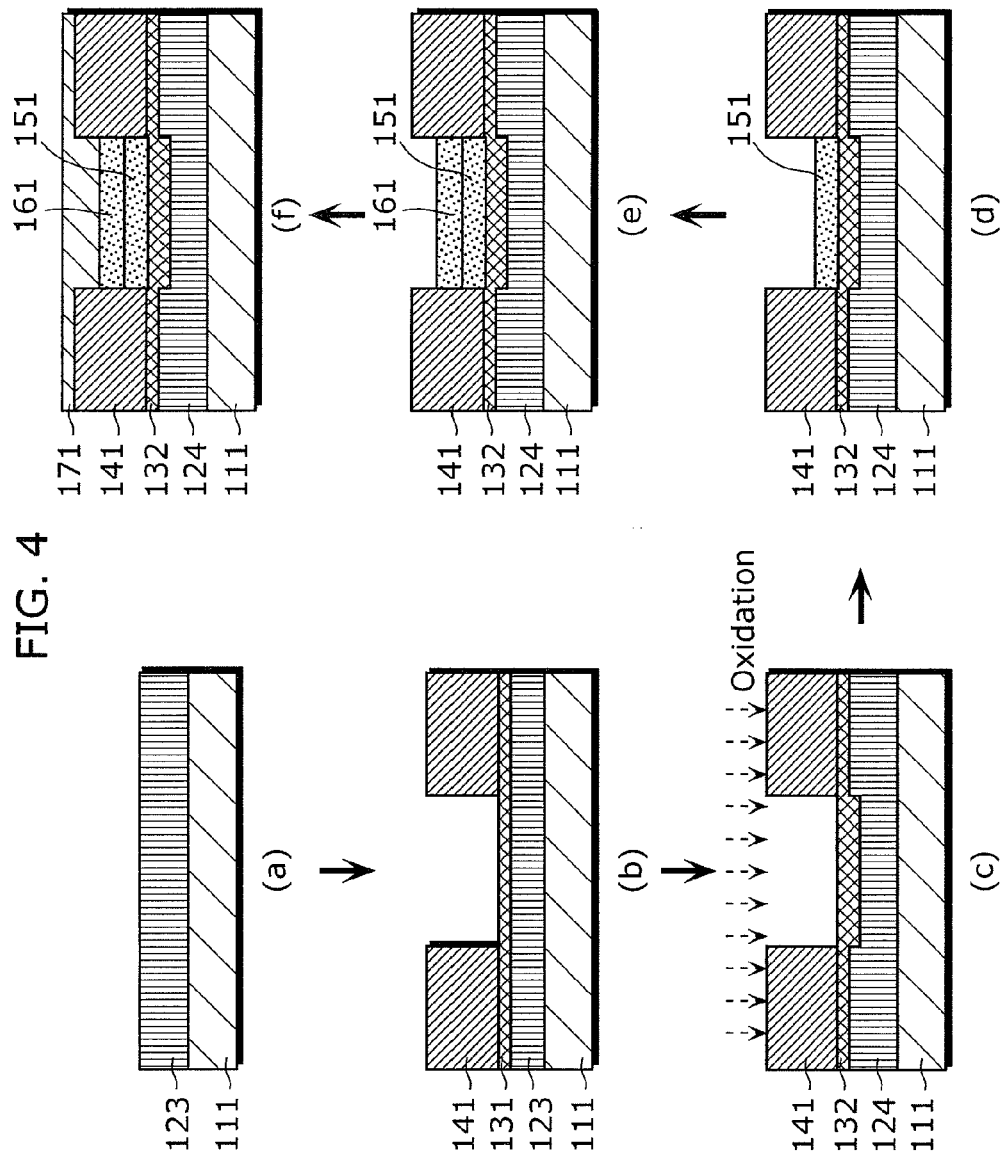
FIG. 4 is a diagram describing the manufacturing method of the organic EL element according to Example 1 of the present invention.

FIG. 4 is a process chart describing a manufacturing method of an organic EL element according to Embodiment 1 of the present invention.

First, on the surface of a glass substrate 111 (using non-soda glass manufactured by Matsunami Glass Ind. Ltd.), an anode 123 having the thickness of 100 nm and made of 97% molybdenum and 3% chrome (hereinafter may be referred to as Mo:Cr (97:3)) was formed by sputtering Subsequently, after patterning the anode 123 by photolithography using photosensitive resist and etching and after delamination of the photosensitive resist patterns, patterning of the anode 123 into a predetermined shape of anode was performed.

A mixture of phosphoric acid, nitric acid, and acetic acid was used as an etchant.

After forming the anode 123 and before forming an insulating layer, the uppermost surface of the anode 123 is naturally oxidized, forming the surface oxidation film 131. Note that, as described earlier, there is a case where the surface oxidized film 131 is not formed by stacking the insulating layer which is the next process, without exposing the element to air after forming of the anode 123 is completed. In this case, the insulating layer 141 is formed on the anode 123 in the next process.

Next, photosensitive polyimide was formed by the spin coating method, and patterning into a predetermined form was performed using exposure with a photo mask and development (FIG. 4 (b)).

Next, the substrate was cleansed using neutral detergent and purified water. During this substrate cleansing process, there is a possibility that a part of the surface oxidized film 131 elutes, since the surface oxidized film 131 is water-soluble. Stacking the hole transport layer on the surface oxidized layer 131 with a part of the surface oxidized layer 131 being eluted causes the metal oxidized layer to be insufficient as the hole injection layer, making the organic EL to have low hole injection capacity. The present invention introduces artificial oxidization process after forming the insulating layer, so as to prevent the reduction in the hole injection property.

As a surface treatment for that purpose, a UV-ozone process (irradiated light: 170 nm ultraviolet light, irradiation time: 120 seconds) was performed, forming the metal oxide layer 132 which function as the hole injection layer (FIG. 4 (c)). That is, the metal oxide layer 132 is an embodiment of the surface oxidized layer 131 after the surface treatment, and includes an oxidized region in which the surface oxidized layer 131 before the surface treatment and in which a part of the anode 123 is artificially oxidized. On the other hand, the anode 124 is a form of the anode 123 after the surface treatment, and which is the anode 123 with the oxidized region being removed. Thus, when this process is finished, the thickness of the metal oxide layer 132 which is the second region where the insulating layer 141 is not formed is greater than the thickness of the metal oxide layer 132 which is a surface oxidized layer formed in the first region under the insulating layer 141.

Next, the HT12 xylene/mesitylene mixed solvent manufactured by Summation was applied to the opening as the hole transport layer 151 by the ink-jet method. Subsequently, vacuum drying at 50 degrees Celsius was performed for ten minutes, and then cross-linking reaction is generated by performing heating in the nitrogen atmosphere at 210 degrees Celsius for 30 minutes. Although slight non-uniformity in the film thickness occurs depending on the location of the opening, the film was formed to have an average thickness of 20 nm (FIG. 4 (d)).

Next, as the organic luminescent layer 161, the green luminescent material Lumation Green (hereinafter referred to as LGr) manufactured by Summation was applied on the opening, using the ink-jet method from the xylene/mesitylene mixed solvent. Subsequently, vacuum drying at 50 degrees Celsius was performed for ten minutes, and baking was subsequently performed for 30 minutes in the nitrogen atmosphere at 130 degrees Celsius. Although slight non-uniformity in the film thickness occurred depending on the location of the opening, the film was formed to have an average thickness of 70 nm (FIG. 4 (e)).

Next, as the cathode layer 171, 5 nm of barium (manufactured by Aldrich, purity 99% or higher) was formed by the vacuum deposition. Subsequently, 20 nm of the compound Alq (manufactured by Nippon Steel Chemical, purity 99% or higher) with 20% of barium mixed is formed by the co-evaporation, and 100 nm of ITO electrode was formed using a plasma coating apparatus manufactured by Sumitomo Heavy Industrial, Ltd) (FIG. 4 (f)).

Finally, a glass tube of the element was sealed in a nitride dry box containing 5 ppm or less concentration of water and oxygen, in order to enable the evaluation of the manufactured organic EL element in the air.

FIG. 5A is a top view of the organic EL device including the organic EL elements manufactured by the manufacturing method in Embodiment 1 of the present invention. FIG. 5B is a structural cross-sectional view of the organic EL device including the organic EL elements manufactured by the manufacturing method in Embodiment 1 of the present invention. In this example, the organic EL device illustrated in FIGS. 5A and 5B were manufactured through the manufacturing process described above.

Example 2

The organic EL element in Example 2 according to the present invention was formed in the same manner as Example 1, except that the cathode layer 171 in FIG. 4 is formed to have 5 nm of barium and 10 nm of silver (manufactured by Aldrich, purity 99.9%), and 80 nm of lithium fluoride was formed as a refractive index adjusting layer.

Example 3

The organic EL element in Example 3 according to the present invention was formed in the same manner as Example 1, except that the oxygen plasma method (plasma time 120 seconds, power 2000 W) was used as a surface treatment method.

Example 4

The organic EL element in Example 4 according to the present invention was manufactured in the same manner as Example 1, except that the film having the thickness of 100 nm made of 3% molybdenum and 97% chrome (hereinafter may be referred to as Mo:Cr (3:97) by the sputtering was used as the anode 123.

Example 5

The organic EL element in Example 5 according to the present invention was formed in the same manner as Example 1 except that the anode 123 made of silver/palladium/copper alloy film having the thickness of 100 nm was formed by the sputtering, and subsequently stacking the anode 123 made of 3% molybdenum and 97% chrome (hereinafter may be referred to as APC/Mo:Cr (3:97) having the thickness of 10 nm by sputtering as well.

Comparative Example 1

The organic EL element in Comparative Example 1 was formed in the same manner as Embodiment 1 except that molybdenum trioxide having the thickness of 30 nm was formed as the hole injection layer by the vapor deposition method, and no surface oxidation was performed.

Comparative Example 2

The organic EL element in Comparative Example 2 was manufactured in the same manner as Example 1, except that the film having the thickness of 100 nm made of 3% molybdenum and 97% chrome was formed as the anode 123, and the conventionally used ITO film of 40 nm was formed thereon by sputtering as well, and etching for patterning the shape of the anode 123 was performed using a mixed solvent of hydrochloric acid and nitric acid.

Comparative Example 3

In the manufacturing method of the organic EL element in comparative example 3, the conventionally used PEDOT:PSS (manufactured by H.C. Stark) was applied to the opening by the ink-jet method. After that, vacuum drying at 50 degrees Celsius is performed for 10 minutes, and vacuum bake at 200 degrees Celsius was subsequently performed for 40 minutes. Although there was slight non-uniformity in the film thickness depending on the location of the opening, the organic EL element was formed in the same manner as Example 1, except that the average film thickness is to be 40 nm.

Comparative Example 4

The organic EL element in Comparative Example 4 was formed in the same manner as Example 1 except that the manufacturing process for HT 12 which was the hole transport layer 151 was skipped.

Comparative Example 5

The organic EL element in Comparative Example 5 was formed in the same manner as Embodiment 1 except that UV-ozone process which is a surface oxidation treatment is skipped.

Evaluation of Embodiment and Comparative Example

The following is the evaluations of Embodiments 1 to 5 and Comparative Examples 1 to 5 in order to display the effect of the present invention.

First, it is important for manufacturing effectively functioning organic EL elements to effectively hold ink including organic materials in the openings. Difference in water repellency between the opening and on the insulating layer is important for this. In order to evaluate the difference, water is dropped after a predetermined surface treatment is performed at the points A and B on the substrate in FIG. 5A. In order to form the hole transport layer 151 and the organic luminescent layer 161, organic solvent such as xylene to which the hole transport layer 151 and the organic luminescent layer 161 are soluble is used. However, when the contact angle is measured using xylene, the contact angle measured is small due to its small surface tension, and it is likely to cause experimental error. Accordingly, the contact angle is measured using water, which has a large surface tension, and hydrophilicity and water repellency are evaluated. The sections in the contact angles A and B in Table 1 lists the evaluation result of the water repellency.

TABLE 1

| | Anode | Surface Treatment | Organic Layer | Contact Angle A | Contact Angle B | Hold of ink in bank | Work function (eV) | Driving voltage (V) | Luminescence efficiency (cd/A) | Life (hour) |
|---|---|---|---|---|---|---|---|---|---|---|
| Example 1 | MoCr (97:3) | UV·O$_3$ | HT/LGr | <5° | 40-50° | good | 5.6 | 7.2 | 5.0 | 560 |
| Example 2 | MoCr (97:3) | UV·O$_3$ | HT/LGr | <5° | 40-50° | good | 5.6 | 7.4 | 4.7 | 450 |
| Example 3 | MoCr (97:3) | O2 Plasma | HT/LGr | <5° | 40-50° | good | 5.6 | 7.4 | 5.1 | 530 |
| Example 4 | MoCr (3:97) | UV·O$_3$ | HT/LGr | <5° | 40-50° | good | 5.5 | 7.3 | 6.2 | 750 |
| Example 5 | APC/MoCr (3:97) | UV·O$_3$ | HT/LGr | <5° | 40-50° | good | 5.5 | 7.4 | 9.3 | 910 |
| Comparative Example 1 | MoCr (97:3) | Form MoO$_3$ | HT/LGr | <5° | <5° | Overflow | 5.6 | — | — | — |
| Comparative Example 2 | MoCr (97:3)/ ITO | UV·O$_3$ | HT/LGr | <5° | 40-50° | good | 5.2 | 8.2 | 0.2 | <5 |
| Comparative Example 3 | MoCr (97:3) | UV·O$_3$ | PEDOT HT/LGr | <5° | 40-50° | good | 5.6 | 6.8 | 2.1 | 310 |
| Comparative Example 4 | MoCr (97:3) | UV·O$_3$ | LGr | <5° | 40-50° | good | 5.6 | 8.1 | 1.3 | <5 |
| Comparative Example 5 | MoCr (97:3) | Cleansing only | HT/LGr | 15° | 75° | Coating not good | 4.7 | 6.7 | 0.2 | <5 |

At the point A on the metal oxide layer 132, Examples 1 to 5 and Comparative Examples 1 to 4 in which oxidation were performed; hydrophilicity is so high that the dropped water spreads to make it unable to measure the contact angle. This shows that the surface of the metal oxide layer 132 and the solvent are highly compatible. The point A in Comparative Example 5 where no oxidation was performed, wettability is slightly lower, with the contact angle approximately at 15 degrees.

At the point B on the insulating layer 141 in Examples 1 to 5 and Comparative Examples 2 to 4 in which oxidation was performed, the contact angles were approximately around 40 to 50 degrees. Since there are variations in measurement and determination of the droplet angle, the values shown have some range. Comparative Example 5 in which no oxidation is performed showed a high value, 75 degrees.

In Comparative Example 1 in which molybdenum trioxide was vapor deposited entirely, molybdenum trioxide is present on the insulating layer. Thus, the contact angle was 5 degrees or less, the same as the metal oxide layer 132 which is oxidized.

Next, xylene 100 ul was dropped on the openings and whether or not the opening could hold the solvent was experimented. The item hold of ink in bank in table 1 lists the results. Examples 1 to 5 and Comparative Examples 2 to 4 which have large differences in water repellency between the openings and on the insulating layer 141 could hold the solvent within the openings well. In Comparative Example 1 in which the molybdenum trioxide film was vapor deposited entirely, there is no difference in hydrophilicity and water repellency between outside the opening and inside the opening. As a result, the solvent could not be held at the opening, flowing out of the opening. Furthermore, in Comparative Example 5 in which only cleansing was performed without oxidation, the solvent was held in the openings. However, not all parts within the opening were filled with the solvent, and part of the opening was not wet.

Next, the work function on the anode after surface treatment was measured. The item "work function" in table 1 lists the results of hydrophilicity and water repellency evaluation. In Examples 1 to 3, Comparative Examples 4 and 5 in which the surface of oxidized MoCr (97:3) was the metal oxide layer forming the opening indicated a work function of 5.5 eV, and in Examples 4 and 5 in which the surface of oxidized MoCr (3:97) was the metal oxide layer 132 forming the opening indicated a work function of 5.6 eV. Comparative Example 1 in which molybdenum trioxide was exposed to the surface indicated the work function of 5.6 eV. This indicates that these surfaces have proper work functions for injecting the holes into the organic layer.

On the other hand, in Comparative Example 2 in which the ITO layer is on the surface as in the conventional example, the work function is 5.2 eV. This was accompanied by a reduction in the hole injecting property. Furthermore, in Comparative Example 5, in which no surface oxidation is performed, the work function is 4.7 eV. Thus, this shows that it is possible to increase work function through oxidation.

Next, a driving voltage and luminescence efficiency were calculated by measuring the driving voltage and a luminance when a current of 10 mA/cm$^2$ with the anode 124 as positive and the cathode 171 as negative were applied on the elements. Furthermore, attenuation of luminance was measured when the elements were caused to be luminescent at 4000 cd/m$^2$ and driven at a constant current, and the time when the luminance halved was determined as the life of element. The items "driving voltage", "luminescence efficiency", and "life" in Table 1 list the results.

In Embodiment 1 according to the present invention, a good driving voltage approximately around 7.2 V, high luminescence efficiency at 5.0 cd/A, and a long luminance half life for 560 hours were obtained.

In Example 2 in which thin silver was used as the cathode layer 171 and Example 3 in which the oxygen plasma method was performed as the oxidation, the capabilities approximately equivalent to Example 1 were achieved.

In Example 4 in which the ratio of molybdenum and chrome was reversed, the reflectivity of the anode improved by approximately 10%. This reduces the loss of light when reflecting on the anode, improving the luminescence efficiency by approximately 10%. With this, only small current value was necessary for generating 4000 cd/cm$^2$, extending the life.

In Example 5 which is a further preferable embodiment of the present invention and in which a highly reflective metal (APC was used here) was used as an anode metal lower layer and MoCr (3:97) was formed thereon, the loss of light in the anode metal lower layer was reduced. The luminescence efficiency was raised to 9.3 cd/A, extending the luminance half life to 910 hours.

On the other hand, in Comparative Example 3 where conventional structured PEDOT: PSS was used, large leak current generated due to high conductivity of PEDOT: PSS and that the PEDOT: PSS slightly wet and spread the insulating film, contacting the cathode. For this reason, the luminescence efficiency is low, and the element life is short.

Furthermore, in Comparative Example 1, there was no difference in hydrophilicity and water repellency, and thus the solution was not able to be held at the opening. Accordingly, the device could not be manufactured.

Furthermore, in Comparative Example 2 where Indium and Tin which were not the metals used for the present invention were used for the anode, a metal oxide layer having sufficiently high work function could not be obtained through surface oxidation treatment. Resultant insufficient hole injection property disrupted the balance of holes and electrons within the element. Thus, the luminescence efficiency was significantly reduced, significantly shortening the life.

In addition, in Comparative Example 4 which did not include the hole transport layer, the hole injection property was not sufficient as in Comparative Example 2. Thus, the luminescence efficiency was low, and the life was significantly short.

In addition, in Comparative Example 5 in which the surface oxidation treatment was not performed, the hole injection property was not sufficient in the same manner as Comparative Examples 2 and 4. Thus, the luminescence efficiency was low, and the life was significantly short.

As described above, the organic EL element according to the present invention was formed by artificially oxidizing the surface oxidized layer 131 at the openings after the insulating layer 141 and the openings were formed on the anode 123 or the surface oxidized layer 131. With this, the organic EL element that has excellent hole injection property, that can reduce the number of organic layers, and that allows forming the hole transport layer and the organic luminescent layer by wet printing.

According to the manufacturing method of the organic EL element according to Embodiment 1 of the present invention, oxidation of the surface oxidized layer 131 at the openings are promoted. As a result, the thickness of the anode 124 at the opening region is smaller than the thickness of the anode 124 under the insulating layer 141.

According to this implementation, it becomes possible to form a hole injection layer having a large work function and capable of reducing the energy barrier for hole injection, though the oxidation of the anode 123. Furthermore, the hole injection layer is the metal oxide layer 132. Accordingly, it is possible to reduce the number of organic layers, which allows forming an organic layer above the hole injection layer by wet printing.

In other words, the thickness of the metal oxide layer 132 in the second region is greater than the thickness of the metal oxide layer 132 in the first region. Thus, regarding the metal oxide layer 132 formed on the anode 124, at the boundary face between the first region and the second region; there is a level difference in which the second region side is located below the first region side. With this, it is possible to reduce what is called the guided wave loss, in which the luminescent light leaks outside through the metal oxide layer 132 formed in the first region as an optical waveguide.

Note that, that the thickness of the anode 124 at the opening region is smaller than the thickness of the anode 124 under the insulating layer 141 can be determined based on the distance from the boundary face to the lower surface of the anode 124, since it is possible to determine the boundary face between the anode 124 which is the metal layer and the metal oxide layer 132 which is the metal oxide layer, using the cross-section TEM.

Furthermore, forming, between the anode and the hole transport layer, the hole injection layer made of a metal oxide having a large work function as shown in Examples allows the anode to have a high hole injection property. Accordingly, it is possible to implement an organic EL element that has high capacity such as the luminescence efficiency and life.

Furthermore, as shown in Example 5, stacking the anode metal layer as two layers, the upper layer and the lower layer, allows forming a lower layer with high visible light reflectivity and high visible light transparency. This further facilitates optimization of the capability of top-emission organic EL element.

Furthermore, in Examples 1 to 5, after the insulating layer was formed, the surface oxidized layer 131 through natural oxidation of the anode 123 was formed at the opening which was the second region. Here, cleansing the surface of the surface oxidized layer 131 at the opening by alkaline solution and others may be performed to elute the surface oxide and to remove the surface oxidized layer 131 at the opening. Subsequently, artificially oxidizing the surface of the anode 123 at the opening on which the surface oxidized layer 131 was removed prevented the surface oxidized layer 131 through natural oxidation from forming. With this, the metal oxide layer 132 at the opening was not formed continually with the metal oxide layer 132 under the insulating layer 141, and the surface oxidized layer 131 at the openings was coated by the anode 124 on the sides and on the lower surface. This allows completely preventing a part of luminescence from leaking outside the device through the metal oxide layer, significantly reducing the guided wave loss of the luminescence. In addition, here, the thickness of the metal oxide layer formed by the artificial oxidation which is the next process is preferably thicker than the surface oxidized layer 131 formed by natural oxidation. With this, the metal oxide layer formed on the metal surface functions as a hole injection layer having excellent hole injection property.

Embodiment 2

An organic EL element according to this embodiment includes: an anode metal layer formed on a substrate; an insulating layer formed on the anode metal layer in a first region; a metal oxide layer formed on the anode metal layer, in a second region other than the first region; a hole transport layer formed on the metal oxide layer in the second region where the insulating layer is not formed; an organic luminescent layer formed on the hole transport layer; and a cathode layer formed on the organic luminescent layer, in which an upper surface of the anode metal layer in the second region is located below an upper surface of the anode metal layer in the first region. This allows forming an organic layer that has superior hole injection property and capable of reducing the number of organic layers by wet printing.

The following specifically describes description for Embodiment 2 of the organic EL element according to the present invention with reference to the drawing in detail.

FIG. 6 is a structural cross-sectional view of the organic EL element according to Embodiment 2 of the present invention. The organic EL element 4 in FIG. 6 includes a substrate 11, an anode metal layer 12, a metal oxide layer 43, an insulating layer 14, a hole transport layer 15, an organic luminescent layer 16, and a cathode layer 17.

The organic EL element 4 in FIG. 6 is different from the organic EL element 1 in FIG. 1 only in that the metal oxide layer is not formed in the first region and under the insulating layer. The description for the same components as the organic EL element in FIG. 1 is omitted, and only the difference shall be hereafter described.

The metal oxide layer 43 has a function to inject holes to the hole transport layer 15 to be described layer, by stably injecting or supporting the generation of the hole. The metal oxide layer 43 is formed through oxidation on the surface of the anode metal layer through the manufacturing process to be described later. Furthermore, the metal oxide layer 43 has a large work function, since the metal oxide layer 43 is composed of the metal element.

Accordingly, the organic EL element 4 according to an aspect of the present invention has a high hole injecting property, thus having high luminescence efficiency and high product life property.

As the thickness of the metal oxide layer 43, 0.1 nm to 20 nm is preferable. More preferable thickness ranges from 1 nm to 10 nm. When the metal oxide layer 43 is too thin, the hole injection property becomes lower due to the problem caused by uniformity, and when the metal oxide layer 43 is too thick, the driving voltage rises.

The process for forming the metal oxide layer 43 on the surface of the anode metal layer 12 is not particularly limited. However, ultraviolet-ozone process, plasma treatment process in oxidized gas atmosphere, or a process using a solution including ozone on the surface of the anode metal layer during the manufacturing process can be suitably used.

In the organic EL element 4 according to Embodiment 2 of the present invention, the upper surface of the anode metal layer 12 in the second region is located below the upper surface of the anode metal layer 12 in the first region.

According to the embodiment, oxidation of the anode metal layer 12 provides a large work function between the anode metal layer 12 and the organic luminescent layer 16, reducing the energy barrier against hole injection. Thus, it is possible to form a hole injection layer with a superior hole injection property. Furthermore, it is not necessary to form the hole injection layer with an organic layer, and thereby reducing the number of organic layers. Furthermore, it is possible to form an organic layer on the hole injection layer by wet printing.

The metal oxide layer 43 is not formed in the first region but in the second region, and the sides and lower surface of the metal oxide layer 43 formed in the second region are coated by the anode metal layer 12.

With this, the sides and lower surface of the metal oxide layer 43 are coated by the anode metal layer 12. Thus, it is possible to prevent part of the luminescence from leaking outside the element through the metal oxide layer 43, reducing the guided wave loss of the luminescence.

Figure 7:
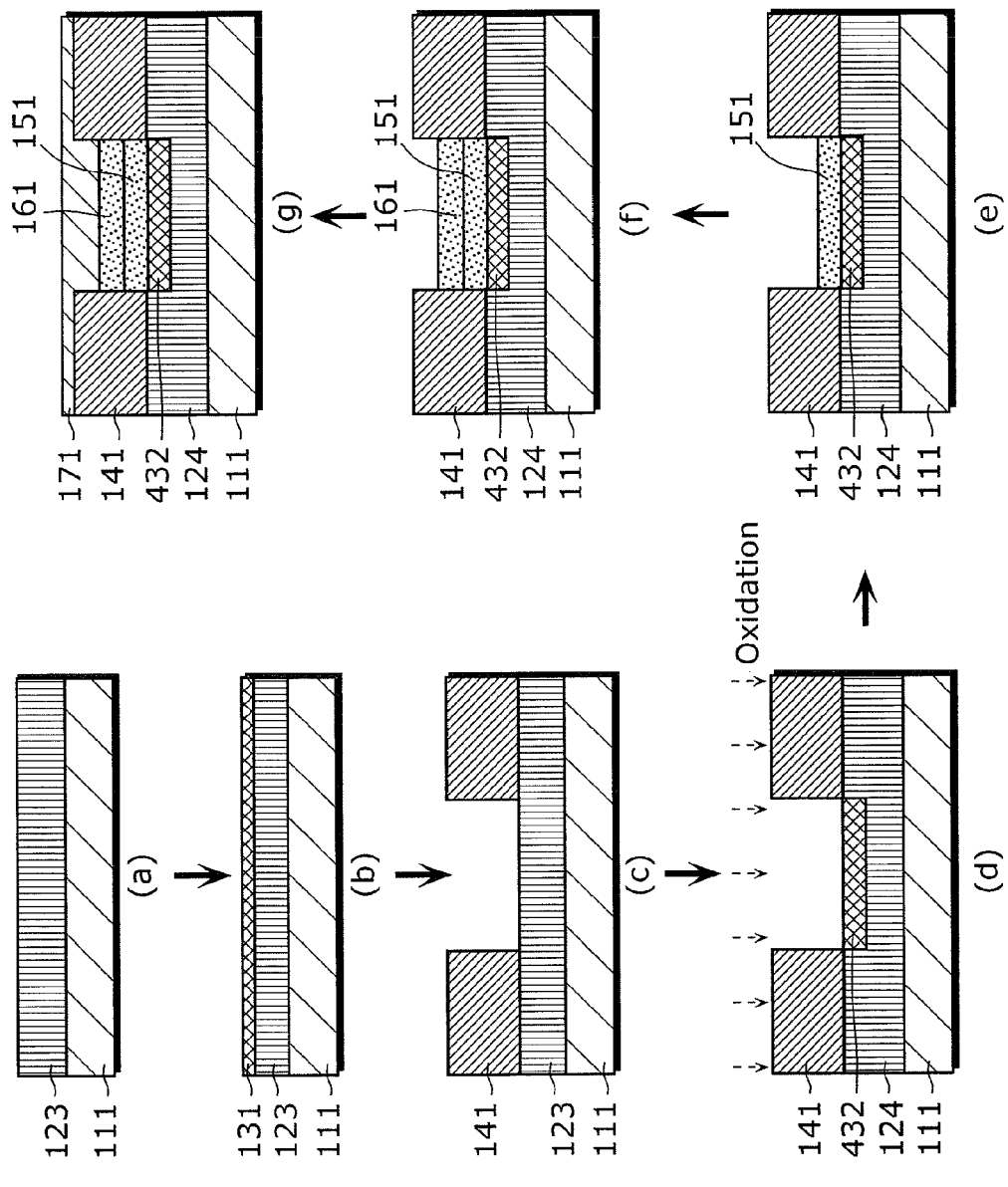
FIG. 7 is a diagram describing the manufacturing method of the organic EL element according to Embodiment 2 of the present invention.

Next, the manufacturing method for the organic EL element 4 according to Embodiment 2 of the present invention is described. FIG. 7 is a process diagram describing the manufacturing method for the organic EL element according to Embodiment 2 of the present invention.

First, on the surface of a glass substrate 111 (using non-soda glass manufactured by Matsunami Glass Ind. Ltd.), an anode 123 having the thickness of 100 nm and made of 97% molybdenum and 3% chrome (hereinafter may be referred to as Mo:Cr (97:3)) is formed by sputtering. Subsequently, through patterning the anode 123 by photolithography using the photosensitive resist and by etching, and delaminating of the photosensitive resist, the anode 123 is patterned into a predetermined anode shape (FIG. 7 (*a*)).

A mixture of phosphoric acid, nitric acid, and acetic acid is used as an etchant.

After the forming of the anode 123 is completed, the uppermost surface of the anode 123 is naturally oxidized through exposing the element to air, forming the surface oxidized layer 131 (FIG. 7 (*b*)).

Here, after the surface oxidized layer 131 is naturally formed, cleansing the surface using alkaline solution and others elutes the surface oxide, removing the surface oxidized layer 131. With this, the insulating film 141 is directly formed on the anode 123 in the next process.

Note that, in addition to the case described earlier, there is a case where it is possible to prevent the surface oxidized film 131 from being formed by stacking the insulating layer which is the next process, without exposing the element to air after forming the anode 123 is completed.

Next, photosensitive polyimide is formed by the spin coating method, and patterning into a predetermined form is performed using exposure with a photo mask and development (FIG. 7 (c)).

Next, the substrate is cleansed using neutral detergent and purified water.

Here, as described above, the surface oxidized layer is not present in this stage in Embodiment 2, and thus the defect that occurs in the embodiments in which the surface oxidized layer is present is prevented beforehand. More specifically, in the cleansing process for the substrate, if the surface oxidized layer 131 is present, there is a possibility that a part of the surface oxidized layer elutes, since the surface oxidized layer is water-soluble. If the hole transport layer is stacked on the layer where a part of the surface oxidized layer is eluted, it makes the metal oxide layer as the hole transport layer insufficient. As a result, it makes an organic EL element to have low hole injection property.

On the other hand, in Embodiment 2, in order to suppress the reduction in the hole injection property, the insulating layer 14 is formed in a state where the surface oxidation film 131 is not present, and subsequently introduces an artificial oxidation treatment.

As the surface treatment for artificial oxidation, a ultraviolet-ozone process (irradiated light: 170 nm ultraviolet light, irradiation time: 120 seconds) is performed, forming the metal oxide layer 432 which function as the hole injection layer (FIG. 7 (d)). That is, the metal oxide layer 432 is an oxidized region in which a part of the anode 123 is artificially oxidized by the surface treatment. On the other hand, the anode 124 is a form of the anode 123 after the surface treatment, and which is the anode 123 with the oxidized region is removed.

Thus, the metal oxide layer 432 is formed only in the second region corresponding to the opening without being formed in the first region corresponding to the insulating layer 14, and the sides and the lower surface of the metal oxide layer 432 are coated with the anode 124, as shown in FIG. 7 (d). According to Embodiment 2, it is possible to prevent the part of luminescence from leaking outside the element through the metal oxide layer, and an additional effect, that is, reducing the guided wave loss of luminescence can be expected as well.

The processes afterwards, that is, processes for forming the hole transport layer 151, the organic luminescent layer 161, and the cathode layer 171 (FIGS. 7 (e), 7 (f), and 7 (g)) is identical to Example 1 in Embodiment 1. Accordingly, the description is omitted here.

According to this implementation, it becomes possible to form a hole injection layer having a large work function and capable of reducing the energy barrier for hole injection though the oxidation of the anode 123. Furthermore, the hole injection layer is the metal oxide layer 432. Accordingly, it is possible to reduce the number of organic layers, which allows forming an organic layer above the layer by wet printing.

Although only some exemplary embodiments of this invention have been described based on Embodiments 1 and 2, those skilled in the art will readily appreciate that many modifications are possible in the exemplary embodiments without materially departing from the novel teachings and advantages of this invention. Accordingly, all such modifications are intended to be included within the scope of this invention.

For example, the anode metal layer 12 in Embodiment 2 may be formed of the anode metal lower layer 121 and the anode metal upper layer 122 as in the anode metal layer in the variation of Embodiment 1.

Note that, although in Embodiments 1 and 2 in the present invention, examples in which high-molecular organic material is used for the hole transport layer 15 and the organic luminescent layer 16. However, even when low-molecular organic material is used for these layers, the same effect as this study can be achieved.

Figure 8:
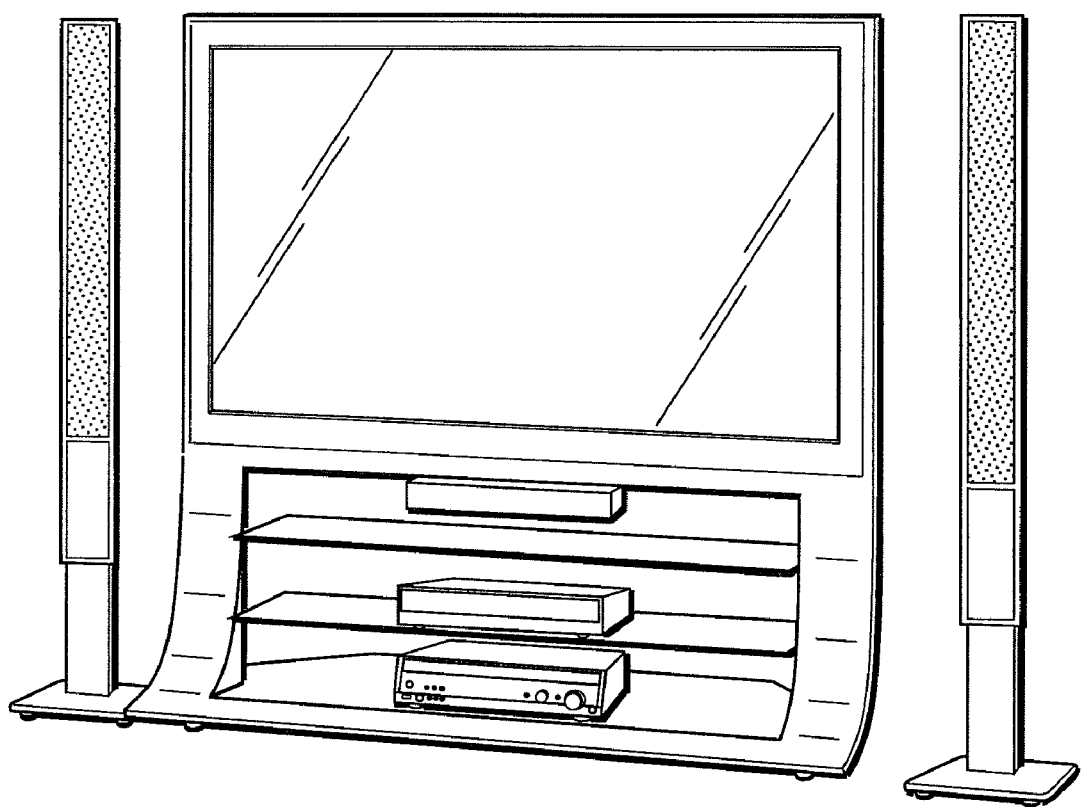
FIG. 8 is an external view of the organic EL element according to the present invention.

Note that, the electrodes included by the organic EL element according to the present invention maybe uniformly formed in the entire surface or the majority of the substrate. In this case, the organic EL element can be used as a lighting device, since a luminescence in large area with a large opening can be obtained. Alternatively, this electrode may be patterned such that a specific graphic or characters can be displayed. In this case, it is possible to use the organic EL element for displaying advertisement, since a luminescence in a specific pattern can be obtained. Alternatively, a number of the electrodes may be arranged in a matrix. In this case, the organic EL elements can be used as the image display device such as a passive-driven display panel. Alternatively, the electrodes may be formed to have an electric connection on a substrate in which a transistor array is arranged, corresponding to the transistor array. In this case, as represented by TV in FIG. 8, the organic EL elements can be used as an image display device such as an active-driven display panel.

INDUSTRIAL APPLICABILITY

The organic EL element according to the present invention has low driving voltage, high efficiency, and long life. Thus, it is useful for pixel luminescence source of the display device, a backlight for a liquid crystal display, various light sources for lighting, light source for the optical device, and others. Particularly, the organic EL element is suitable for an application for an active-matrix organic EL display panel combined with a TFT.

What is claimed is:
1. An organic electroluminescence element, comprising:
   a substrate;
   an anode metal layer above the substrate, the anode metal layer including an inner region between a pair of outer regions;
   a metal oxide layer on the inner region and the outer regions of the anode metal layer, the metal oxide layer formed by oxidation of a top surface of the anode metal layer;
   an insulating layer above the metal oxide layer and the outer regions of the anode metal layer;
   a hole transport layer above the metal oxide layer and the inner region of the anode metal layer, the hole transport layer comprising a hole-transporting organic material;
   an organic luminescent layer above the hole transport layer; and
   a cathode layer above the organic luminescent layer for injecting electrons into the organic luminescent layer,
   wherein a thickness of the metal oxide layer on the inner region of the anode metal layer is greater than a thickness of the metal oxide layer on the outer regions of the anode metal layer.
2. The organic electroluminescence element according to claim 1, wherein a lower surface of the metal oxide layer on the inner region of the anode metal layer is below a lower surface of the metal oxide layer on the outer regions of the anode metal layer.

3. The organic electroluminescence element according to claim 1, wherein the anode metal layer includes:
   an anode metal lower layer having a visible light reflectivity of at least 60%; and
   an anode metal upper layer on the anode metal lower layer between the anode metal lower layer and the metal oxide layer.

4. The organic electroluminescence element according to claim 3,
   wherein the anode metal lower layer comprises at least one of aluminum and silver, and
   the anode metal upper layer comprises at least one of molybdenum, chrome, vanadium, tungsten, nickel, and iridium.

5. The organic electroluminescence element according to claim 3, wherein a thickness of the anode metal upper layer in the inner region is at most 20 nm.

6. The organic electroluminescence element according to claim 5, wherein the anode metal upper layer is not in the inner region of the anode metal layer.

7. The organic electroluminescence element according to claim 1, wherein the anode metal layer comprises at least one of silver, molybdenum, chrome, vanadium, tungsten, nickel, and iridium.

8. A lighting device including the organic electroluminescence element according to claim 1.

9. An image display device including the organic electroluminescence element according to claim 1.

10. An organic electroluminescence element, comprising:
    a substrate;
    an anode metal layer above the substrate, the anode metal layer including an inner region between a pair of outer regions;
    a metal oxide layer on the inner region and the outer regions of the anode metal layer, the metal oxide layer formed by oxidation of a top surface of the anode metal layer;
    an insulating layer above the metal oxide layer and the outer regions of the anode metal layer;
    a hole transport layer above the metal oxide layer and the inner region of the anode metal layer, the hole transport layer comprising a hole-transporting organic material;
    an organic luminescent layer above the hole transport layer; and
    a cathode layer above the organic luminescent layer for injecting electrons into the organic luminescent layer,
    wherein the metal oxide layer extends continuously on the anode metal layer from one of the outer regions, along the inner region, and to an other of the outer regions, and
    at a boundary of the inner region and the outer regions, a lower surface of the metal oxide layer on the inner region is located below the lower surface of the metal oxide layer on the outer regions.

11. The organic electroluminescence element according to claim 10, wherein the anode metal layer includes:
    an anode metal lower layer having a visible light reflectivity of at least 60%; and
    an anode metal upper layer on the anode metal lower layer between the anode metal lower layer and the metal oxide layer.

12. The organic electroluminescence element according to claim 11,
    wherein the anode metal lower layer comprises at least one of aluminum and silver, and
    the anode metal upper layer comprises at least one of molybdenum, chrome, vanadium, tungsten, nickel, and iridium.

13. The organic electroluminescence element according to claim 11, wherein a thickness of the anode metal upper layer in the inner region is at most 20 nm.

14. The organic electroluminescence element according to claim 13, wherein the anode metal upper layer is not in the inner region of the anode metal layer.

15. The organic electroluminescence element according to claim 10, wherein the anode metal layer comprises at least one of silver, molybdenum, chrome, vanadium, tungsten, nickel, and iridium.

16. A lighting device including the organic electroluminescence element according to claim 10.

17. An image display device including the organic electroluminescence element according to claim 10.

18. An organic electroluminescence element, comprising:
    a substrate;
    an anode metal layer above the substrate, the anode metal layer including an inner region between a pair of outer regions;
    a metal oxide layer on the inner region of the anode metal layer, the metal oxide layer formed by oxidation of a top surface of the anode metal layer;
    an insulating layer on the outer regions of the anode metal layer;
    a hole transport layer above the metal oxide layer and the inner region of the anode metal layer, the hole transport layer comprising a hole-transporting organic material;
    an organic luminescent layer above the hole transport layer; and
    a cathode layer above the organic luminescent layer for injecting electrons into the organic luminescent layer,
    wherein a lower surface and sides of the metal oxide layer abut the anode metal layer.

19. The organic electroluminescence element according to claim 18, wherein the anode metal layer includes:
    an anode metal lower layer having a visible light reflectivity of at least 60%; and
    an anode metal upper layer on the anode metal lower layer between the anode metal lower layer and the metal oxide layer and between the anode metal lower layer and the insulating layer.

20. The organic electroluminescence element according to claim 19,
    wherein the anode metal lower layer comprises at least one of aluminum and silver, and
    the anode metal upper layer comprises at least one of molybdenum, chrome, vanadium, tungsten, nickel, and iridium.

21. The organic electroluminescence element according to claim 19, wherein a thickness of the anode metal upper layer in the inner region is at most 20 nm.

22. The organic electroluminescence element according to claim 21, wherein the anode metal upper layer is not in the inner region of the anode metal layer.

23. The organic electroluminescence element according to claim 18, wherein the anode metal layer comprises at least one of silver, molybdenum, chrome, vanadium, tungsten, nickel, and iridium.

24. A lighting device including the organic electroluminescence element according to claim 18.

25. An image display device including the organic electroluminescence element according to claim 18.

* * * * *